(12) United States Patent
Yokoyama et al.

(10) Patent No.: US 11,600,501 B2
(45) Date of Patent: Mar. 7, 2023

(54) ETCHING METHOD AND PLASMA PROCESSING APPARATUS

(71) Applicant: Tokyo Electron Limited, Tokyo (JP)

(72) Inventors: Takahiro Yokoyama, Miyagi (JP); Maju Tomura, Miyagi (JP); Yoshihide Kihara, Miyagi (JP); Ryutaro Suda, Miyagi (JP); Takatoshi Orui, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/090,991

(22) Filed: Nov. 6, 2020

(65) Prior Publication Data

US 2021/0143028 A1 May 13, 2021

(30) Foreign Application Priority Data

| Nov. 8, 2019 | (JP) | JP2019-203326 |
| Mar. 19, 2020 | (JP) | JP2020-049399 |
| Oct. 7, 2020 | (JP) | JP2020-169758 |

(51) Int. Cl.
*H01L 21/67* (2006.01)
*C23C 16/02* (2006.01)
*H01J 37/32* (2006.01)

(52) U.S. Cl.
CPC .... *H01L 21/67069* (2013.01); *C23C 16/0245* (2013.01); *H01J 37/32449* (2013.01); *H01J 37/32715* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| 6,635,185 | B2 * | 10/2003 | Demmin | H01L 21/32137 |
| | | | | 257/E21.252 |
| 7,951,683 | B1 | 5/2011 | Shanker | |
| 8,440,572 | B2 | 5/2013 | Honda | |
| 10,453,684 | B1 * | 10/2019 | Zhang | H01L 21/32137 |
| 10,741,406 | B2 * | 8/2020 | Oomori | H01L 21/30604 |
| 10,861,693 | B2 | 12/2020 | Stone et al. | |
| 2003/0098288 | A1 | 5/2003 | Mori et al. | |
| 2006/0073706 | A1 | 4/2006 | Li et al. | |
| 2010/0093178 | A1 | 4/2010 | Honda | |

(Continued)

OTHER PUBLICATIONS

U.S. Office Action dated Apr. 27, 2022 in U.S. Appl. No. 17/666,570.

(Continued)

*Primary Examiner* — Shamim Ahmed
(74) *Attorney, Agent, or Firm* — Xsensus LLP

(57) ABSTRACT

An etching method enables plasma etching of a silicon-containing film with reduced lateral etching. The etching method includes providing a substrate in a chamber included in a plasma processing apparatus. The substrate includes a silicon-containing film. The etching method further includes setting a flow rate proportion of a phosphorus-containing gas with respect to a total flow rate of the process gas so as to establish a predetermined ratio of an etching rate of an alternate stack of a silicon oxide film and a silicon nitride film to an etching rate of the silicon oxide film.

20 Claims, 9 Drawing Sheets

(56) References Cited

U.S. PATENT DOCUMENTS

| | | |
|---|---|---|
| 2011/0312180 A1 | 12/2011 | Wang |
| 2013/0323932 A1 | 12/2013 | Guha |
| 2014/0248718 A1 | 9/2014 | Kim et al. |
| 2015/0214474 A1 | 7/2015 | Nishimura et al. |
| 2016/0343580 A1 | 11/2016 | Hudson |
| 2017/0133233 A1 | 5/2017 | Sato et al. |
| 2017/0222139 A1 | 8/2017 | Nishimura et al. |
| 2017/0338119 A1 | 11/2017 | Zhang et al. |
| 2018/0233356 A1 | 8/2018 | Han et al. |
| 2018/0366336 A1* | 12/2018 | Shen ................ H01L 21/30655 |
| 2019/0131140 A1* | 5/2019 | Sun .................. H01L 21/32137 |
| 2019/0185996 A1 | 6/2019 | Jha et al. |

OTHER PUBLICATIONS

U.S. Final Office Action datedM ar. 3, 2022 in U.S. Appl. No. 17/090,964.

* cited by examiner

ETCHING METHOD AND PLASMA PROCESSING APPARATUS

CROSS-REFERENCE TO RELATED APPLICATIONS

This application claims priority to Japanese Patent Application Nos. 2019-203326 filed on Nov. 8, 2019, 2020-049399 filed on Mar. 19, 2020, and 2020-169758 filed on Oct. 7, 2020, the entire disclosures of each of which are incorporated herein by reference. This application is related to U.S. application Ser. No. 16/930,483, filed Jul. 16, 2020 which is a Bypass Continuation-in-Part of PCT/JP/2020/005847 filed 14 Feb. 2020.

BACKGROUND

Technical Field

Exemplary embodiments of the present disclosure relate to an etching method and a plasma processing apparatus.

Description of the Background

Manufacturing electronic devices includes plasma etching of silicon-containing films on substrates. Plasma etching of silicon-containing films uses process gases containing fluorocarbon gases. Such plasma etching is described in Patent Literature 1.

CITATION LIST

Patent Literature

Patent Literature 1: U.S. Patent Application Publication No. 2016/0343580

BRIEF SUMMARY

The present disclosure is directed to a technique for plasma etching of a silicon-containing film with reduced lateral etching.

An etching method includes providing a substrate in a chamber included in a plasma processing apparatus. The substrate includes a silicon-containing film. The etching method further includes setting a flow rate proportion of a phosphorus-containing gas with respect to a total flow rate of the process gas so as to establish a predetermined ratio of an etching rate of an alternate stack of a silicon oxide film and a silicon nitride film to an etching rate of the silicon oxide film.

The technique according to an exemplary embodiment enables plasma etching of a silicon-containing film with reduced lateral etching.

DETAILED DESCRIPTION

Figure 1:
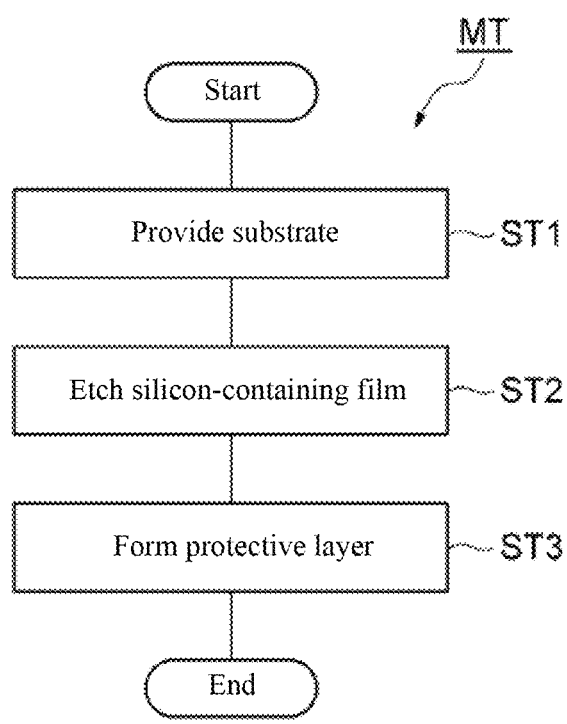
FIG. 1 is a flowchart of an etching method according to an exemplary embodiment.

Exemplary embodiments will now be described.

An etching method according to one exemplary embodiment includes providing a substrate in a chamber included in a plasma processing apparatus. The substrate includes a silicon-containing film. The etching method further includes setting a flow rate proportion of a phosphorus-containing gas with respect to a total flow rate of the process gas so as to establish a predetermined ratio of an etching rate of an alternate stack of a silicon oxide film and a silicon nitride film to an etching rate of the silicon oxide film.

In the above embodiment, a recess is formed in the silicon-containing film by etching, and a protective film containing silicon and the phosphorus contained in the process gas is formed on the surface of a side wall defining the recess. The protective film protects the side wall surface while the silicon-containing film is being etched. This method enables plasma etching of the silicon-containing film with reduced lateral etching.

The etching method according to one exemplary embodiment may further include forming a protective film on a surface of a side wall defining a recess formed by the etching.

The protective film contains the phosphorus contained in the process gas.

In one exemplary embodiment, the etching and the forming the protective film may be performed at the same time.

In one exemplary embodiment, the process gas may contain at least one phosphorus-containing molecule (or more generally at least one phosphorous-containing compound) selected from the group consisting of $PF_3$, $PCl_3$, $PF_5$, $PCl_5$, $POCl_3$, $PH_3$, $PBr_3$, and $PBr_5$.

In one exemplary embodiment, the process gas may further contain carbon and hydrogen.

In one exemplary embodiment, the process gas may contain at least one hydrogen-containing molecule selected from the group consisting of $H_2$, HF, $C_xH_y$, $CH_xF_y$, and $NH_3$, where x and y are natural numbers.

In one exemplary embodiment, the halogen may be fluorine.

In one exemplary embodiment, the process gas may further contain oxygen.

In one exemplary embodiment, the silicon-containing film may include at least two silicon-containing films with different compositions.

In one exemplary embodiment, the at least two silicon-containing films may include a silicon oxide film and a silicon nitride film. In another exemplary embodiment, the at least two silicon-containing films may include a silicon oxide film and a silicon film. In another exemplary embodiment, the at least two silicon-containing films may include a silicon oxide film, a silicon nitride film, and a silicon film.

In one exemplary embodiment, the substrate may further include a mask on the silicon-containing film.

In one exemplary embodiment, the substrate may be set to a temperature lower than or equal to 0° C. at the start of the etching.

A plasma processing apparatus according to another exemplary embodiment includes a chamber, a substrate support, a controllable gas supply (also referred to as a controllable gas supply), and a radio-frequency power supply. The substrate support supports a substrate in the chamber. The controllable gas supply supplies, into the chamber, a process gas for etching a silicon-containing film. The process gas contains a halogen and phosphorus. The radio-frequency power supply generates radio-frequency power usable for generating plasma from the process gas in the chamber.

Exemplary embodiments will now be described in detail with reference to the drawings. In the drawings, similar or corresponding components are indicated by like reference numerals. The embodiments are illustrated by way of example and not by way of limitation in the accompanying drawings that are not to scale unless otherwise indicated.

FIG. 1 is a flowchart of an etching method according to an exemplary embodiment. The etching method shown in FIG. 1 (hereinafter referred to as the method MT) includes steps ST1 and ST2. The method MT is used for a substrate including a silicon-containing film. The silicon-containing film is etched with the method MT.

Figure 2:
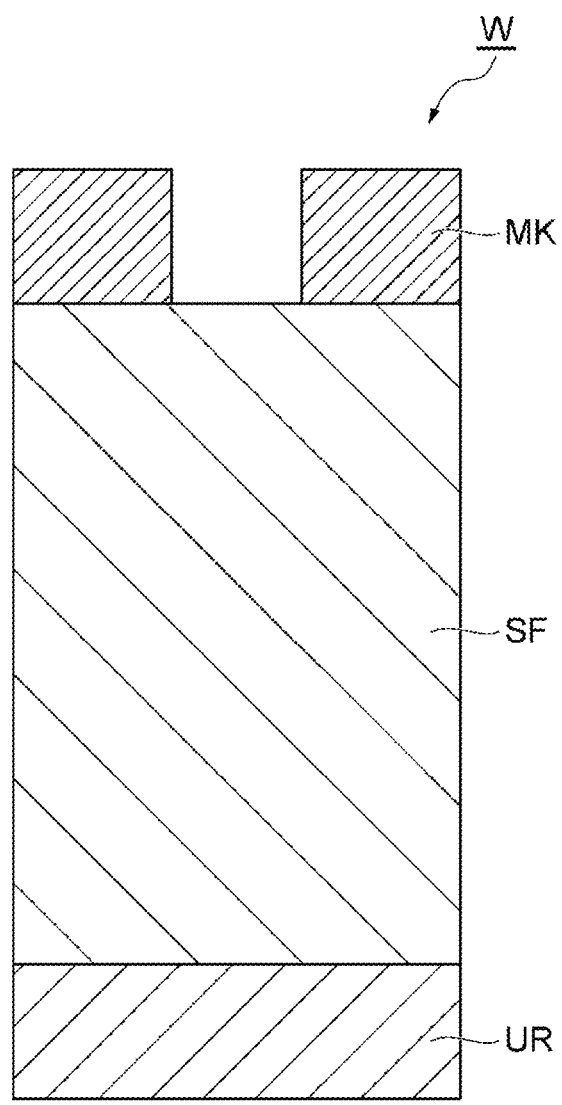
FIG. 2 is a partially enlarged cross-sectional view of an exemplary substrate to be processed with the etching method shown in FIG. 1.

FIG. 2 is a partially enlarged cross-sectional view of an exemplary substrate to be processed with the etching method shown in FIG. 1. A substrate W shown in FIG. 2 can be used for manufacturing devices such as a dynamic random-access memory (DRAM) and a 3D-NAND. The substrate W includes a silicon-containing film SF. The substrate W may further include an underlying region UR. The silicon-containing film SF may be located on the underlying region UR. The silicon-containing film SF may be a silicon-containing dielectric film. The silicon-containing dielectric film may include a silicon oxide film or a silicon nitride film. The silicon-containing dielectric film may be any other silicon-containing film with a different composition. The silicon-containing film SF may include a silicon film (e.g., a polycrystalline silicon film). The silicon-containing film SF may include at least two silicon-containing films with different compositions. The at least two silicon-containing films may include a silicon oxide film and a silicon nitride film. The silicon-containing film SF may be a multilayer including an alternate stack of one or more silicon oxide films and one or more silicon nitride films. In some embodiments, the at least two silicon-containing films may include a silicon oxide film and a silicon film. The silicon-containing film SF may be a multilayer including an alternate stack of one or more silicon oxide films and one or more silicon films. In another exemplary embodiment, the at least two silicon-containing films may include a silicon oxide film, a silicon nitride film, and a silicon film.

The substrate W may further include a mask MK. The mask MK is located on the silicon-containing film SF. The mask MK is formed of a material having a lower etching rate than the silicon-containing film SF in step ST2. The mask MK may be formed from an organic material. The mask MK may be formed from, for example, an amorphous carbon film, a photoresist film, or a spin-on-carbon (SOC) film. The mask MK may be a metal-containing mask formed from a metal-containing material, such as titanium nitride, tungsten, or tungsten carbide. The mask MK may have a thickness of 3 μm or more.

The mask MK is patterned. More specifically, the mask MK has a pattern to be transferred onto the silicon-containing film SF in step ST2. With the pattern of the mask MK transferred onto the silicon-containing film SF, the silicon-containing film SF can have a recess such as a hole or a trench, with sidewall(s). The recess in the silicon-containing film SF in step ST2 may have an aspect ratio of 20 or more, or 40 or 50 or more.

Figure 3:
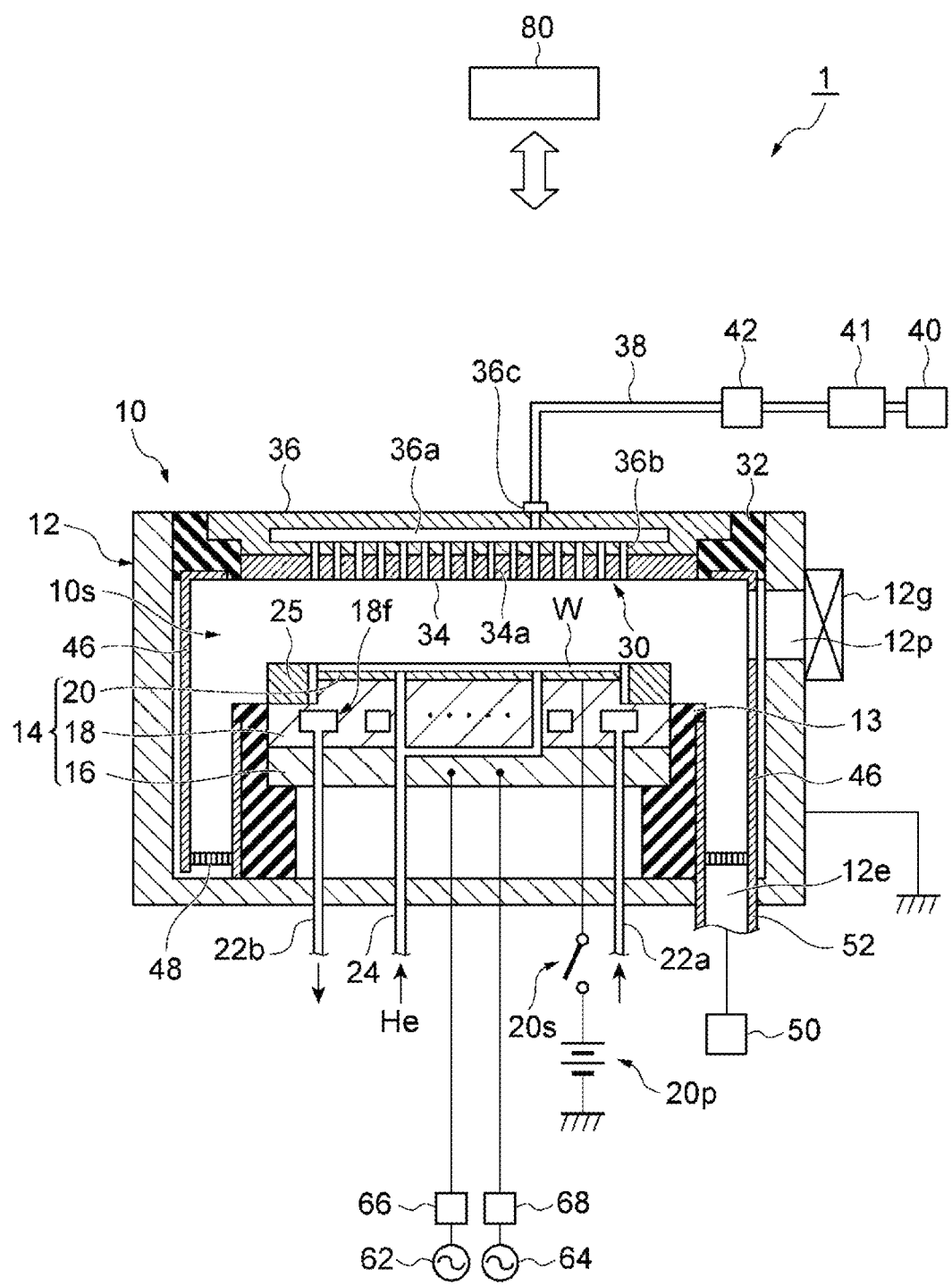
FIG. 3 is a schematic diagram of a plasma processing apparatus according to an exemplary embodiment.

The method MT is used by a plasma processing apparatus for etching the silicon-containing film SF. FIG. 3 is a schematic diagram of a plasma processing apparatus according to an exemplary embodiment. A plasma processing apparatus 1 shown in FIG. 3 includes a chamber 10 with an internal space 10s. The chamber 10 includes a chamber body 12, which is substantially cylindrical and is formed from, for example, aluminum. The chamber body 12 has an inner wall coated with an anticorrosive film, which may be formed from ceramic such as aluminum oxide or yttrium oxide.

The chamber body 12 has a side wall having a port 12p. The substrate W is transferred between the internal space 10s and the outside of the chamber 10 through the port 12p. The port 12p is open and closed by a gate valve 12g that is on the side wall of the chamber body 12.

A support 13 is located on the bottom of the chamber body 12. The support 13 is substantially cylindrical and is formed from an insulating material. The support 13 extends upward from the bottom of the chamber body 12 into the internal space 10s. The support 13 supports a substrate support 14. The substrate support 14 supports the substrate W in the internal space 10s.

The substrate support 14 includes a lower electrode 18 and an electrostatic chuck (ESC) 20. The substrate support 14 may further include an electrode plate 16. The electrode plate 16 is formed from a conductor such as aluminum and is substantially disk-shaped. The lower electrode 18 is on the electrode plate 16. The lower electrode 18 is formed from a conductor such as aluminum and is substantially disk-shaped. The lower electrode 18 is electrically coupled to the electrode plate 16.

The ESC 20 is on the lower electrode 18. The substrate W is placed on an upper surface of the ESC 20. The ESC 20 includes a body and an electrode. The body of the ESC 20 is substantially disk-shaped and is formed from a dielectric. In the ESC 20, the electrode is a film electrode located in the body. The electrode in the ESC 20 is coupled to a direct-current (DC) power supply 20p via a switch 20s. A voltage is applied from the DC power supply 20p to the electrode in the ESC 20 to generate an electrostatic attraction between the ESC 20 and the substrate W. The substrate W is attracted to and held by the ESC 20 under the generated electrostatic attraction.

An edge ring 25 is placed on the substrate support 14. The edge ring 25 is annular. The edge ring 25 may be formed from silicon, silicon carbide, or quartz. The substrate W is placed in an area on the ESC 20 surrounded by the edge ring 25.

The lower electrode 18 has an internal channel 18f for carrying a heat-exchange medium (e.g., refrigerant) being supplied through a pipe 22a from a chiller unit external to the chamber 10. The heat-exchange medium being supplied to the channel 18f returns to the chiller unit through a pipe 22b. In the plasma processing apparatus 1, the temperature of the substrate W on the ESC 20 is adjusted through heat exchange between the heat-exchange medium and the lower electrode 18.

The plasma processing apparatus 1 includes a gas supply line 24. The gas supply line 24 supplies a heat-transfer gas (e.g., He gas) from a heat-transfer gas supply assembly to a space between the upper surface of the ESC 20 and a back surface of the substrate W.

The plasma processing apparatus 1 further includes an upper electrode 30 that is located above the substrate support 14. The upper electrode 30 is supported on an upper portion of the chamber body 12 with a member 32, which is formed from an insulating material. The upper electrode 30 and the member 32 close a top opening of the chamber body 12.

The upper electrode 30 may include a ceiling plate 34 and a support member 36.

The ceiling plate 34 has its lower surface exposed to and defining the internal space 10s. The ceiling plate 34 is formed from a low resistance conductor or a semiconductor that generates less Joule heat. The ceiling plate 34 has multiple gas outlet holes 34a that are through-holes in the thickness direction.

The support member 36 supports the ceiling plate 34 in a detachable manner. The support member 36 is formed from a conductive material such as aluminum. The support member 36 has an internal gas-diffusion compartment 36a. The support member 36 has multiple gas holes 36b that extend downward from the gas-diffusion compartment 36a. The gas holes 36b communicate with the respective gas outlet holes 34a. The support member 36 has a gas inlet 36c that connects to the gas-diffusion compartment 36a and to a gas supply pipe 38.

The gas supply pipe 38 is connected to a set of gas sources 40 via a set of flow controllers 41 and a set of valves 42. The flow controller set 41 and the valve set 42 form a controllable gas supply. The controllable gas supply may further include the gas source set 40. The gas source set 40 includes multiple gas sources. The gas sources include the sources of the process gas used with the method MT. The flow controller set 41 includes multiple flow controllers. The flow controllers in the flow controller set 41 are mass flow controllers or pressure-based flow controllers. The valve set 42 includes multiple open-close valves. The gas sources in the gas source set 40 are connected to the gas supply pipe 38 via the respective flow controllers in the flow controller set 41 and via the respective open-close valves in the valve set 42.

The plasma processing apparatus 1 includes a shield 46 along the inner wall of the chamber body 12 and along the periphery of the support 13 in a detachable manner. The shield 46 prevents a reaction product from accumulating on the chamber body 12. The shield 46 includes, for example, an aluminum base coated with an anticorrosive film. The anticorrosive film may be a film of ceramic such as yttrium oxide.

A baffle plate 48 is located between the support 13 and the side wall of the chamber body 12. The baffle plate 48 includes, for example, an aluminum member coated with an anticorrosive film (e.g., yttrium oxide film). The baffle plate 48 has multiple through-holes. The chamber body 12 has an outlet 12e in its bottom below the baffle plate 48. The outlet 12e is connected to an exhaust device 50 through an exhaust pipe 52. The exhaust device 50 includes a pressure control valve and a vacuum pump such as a turbomolecular pump.

The plasma processing apparatus 1 includes a first radio-frequency (RF) power supply 62 and a second RF power supply 64. The first RF power supply 62 generates first RF power having a frequency suitable for generating plasma. The first RF power has a frequency ranging from, for example, 27 to 100 MHz. The first RF power supply 62 is coupled to the lower electrode 18 via an impedance matching circuit, or matcher 66, and the electrode plate 16. The matcher 66 includes a circuit for matching the output impedance of the first RF power supply 62 and the impedance of a load (the lower electrode 18). The first RF power supply 62 may be coupled to the upper electrode 30 via the matcher 66. The first RF power supply 62 serves as an exemplary plasma generator.

The second RF power supply 64 generates second RF power having a lower frequency than the first RF power. The second RF power, when used in addition to the first RF power, serves as bias RF power for drawing ions toward the substrate W. The second RF power has a frequency ranging from, for example, 400 kHz to 13.56 MHz. The second RF power supply 64 is coupled to the lower electrode 18 via an impedance matching circuit, or matcher 68, and the electrode plate 16. The matcher 68 includes a circuit for matching the output impedance of the second RF power supply 64 and the impedance of a load (the lower electrode 18).

The second RF power alone may be used to generate plasma, without the first RF power being used. In other words, a single RF power may be used to generate plasma. In this case, the second RF power may have a frequency higher than 13.56 MHz, or for example, 40 MHz. In this case, the plasma processing apparatus 1 may not include the first RF power supply 62 and the matcher 66. In this case, the second RF power supply 64 serves as an exemplary plasma generator.

The controllable gas supply supplies a gas into the internal space 10s for plasma processing in the plasma processing apparatus 1. The first RF power and/or the second RF power are provided to form, between the upper electrode 30 and the lower electrode 18, an RF electric field. The resultant RF electric field generates plasma from the gas in the internal space 10s.

The plasma processing apparatus 1 may further include a controller 80, which may be implemented as the control circuitry 130, discussed later in reference to FIG. 9. The controller 80 may be a computer including a processor, a storage such as a memory, an input device, a display, and an input-output interface for signals. The controller 80 controls the components of the plasma processing apparatus 1. An operator can use the input device in the controller 80 to input a command or perform other operations for managing the plasma processing apparatus 1. The display in the controller 80 can display and visualize the operating state of the plasma processing apparatus 1. The storage stores control programs and recipe data. The control program is executed by the processor to perform the processing in the plasma processing apparatus 1. The processor executes the control program to control the components of the plasma processing apparatus 1 in accordance with the recipe data.

Referring back to FIG. 1, the method MT used by the plasma processing apparatus 1 to process the substrate W shown in FIG. 2 will be described by way of example. The components of the plasma processing apparatus 1 are controlled by the controller 80 to allow the plasma processing apparatus 1 to implement the method MT. The control by the controller 80 over the components of the plasma processing apparatus 1 to implement the method MT will also be described below.

The method MT starts from step ST1. In step ST1, the substrate W is provided in the chamber 10. The substrate W is placed onto and held by the ESC 20 in the chamber 10. The substrate W may have a diameter of 300 mm.

The method MT includes step ST2 to be performed next. In step ST2, a silicon-containing film SF is etched with a chemical species in plasma generated from a process gas in the chamber 10.

The process gas used in step ST2 contains a halogen and phosphorus. The halogen contained in the process gas may be fluorine. The process gas may contain at least one of a fluorocarbon or a hydrofluorocarbon. The fluorocarbon may be at least one of $CF_4$, $C_3F_8$, $C_4F_6$, or $C_4F_8$. The hydrofluorocarbon may be at least one of $CH_2F_2$, $CHF_3$, or $CH_3F$. The hydrofluorocarbon may contain at least two carbon atoms. The process gas may contain at least one phosphorus-containing molecule. The phosphorus-containing molecule may be an oxide such as tetraphosphorus decaoxide ($P_4O_{10}$), tetraphosphorus octoxide ($P_4O_8$), or tetraphosphorus hexaoxide ($P_4O_6$). Tetraphosphorus decaoxide may also be called diphosphorus pentaoxide ($P_2O_5$). The phosphorus-containing molecule may be a halide such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), or phosphorus iodide ($PI_3$). More specifically, the halogen contained in the phosphorus-containing molecule may be fluorine. In some embodiments, the phosphorus-containing molecule may contain a non-fluorine halogen. The phosphorus-containing molecule may be a phosphoryl halide such as phosphoryl fluoride ($POF_3$), phosphorus oxychloride ($POCl_3$), or phosphoryl bromide ($POBr_3$). The phosphorus-containing molecule may be phosphine ($PH_3$), calcium phosphide (e.g., $Ca_3P_2$), phosphoric acid ($H_3PO_4$), sodium phosphate ($Na_3PO_4$), or hexafluorophosphoric acid ($HPF_6$). The phosphorus-containing molecule may be a fluorophosphine ($H_xPF_y$), where the sum of x and y is 3 or 5. The fluorophosphine ($H_xPF_y$) may be, for example, $HPF_2$ or $H_2PF_3$. The process gas may contain at least one of such phosphorus-containing molecules. For example, the process gas may contain at least one phosphorus-containing molecule selected from the group consisting of $PF_3$, $PCl_3$, $PF_5$, $PCl_5$, $POCl_3$, $PH_3$, $PBr_3$, and $PBr_5$. A phosphorus-containing molecule in either liquid or solid form may be vaporized by, for example, heating before being supplied into the chamber 10.

The process gas used in step ST2 may further contain carbon and hydrogen. The process gas may contain at least one hydrogen-containing molecule selected from the group consisting of $H_2$, hydrogen fluoride (HF), a hydrocarbon ($C_xH_y$), a hydrofluorocarbon ($CH_xF_y$), and $NH_3$. The hydrocarbon ($C_xH_y$) may be, for example, $CH_4$ or $C_3H_6$, where x and y are natural numbers. The process gas may contain at least one carbon-containing molecule selected from the group consisting of a fluorocarbon and a hydrocarbon (e.g., $CH_4$). The process gas may further contain oxygen. The process gas may contain, for example, $O_2$.

The process gas used in step ST2 contains a phosphorus-containing gas to be a source of phosphorus. The phosphorus-containing gas contains at least one of the phosphorus-containing molecules listed above. In one embodiment, step ST2 is used for the silicon-containing film SF including the silicon oxide film and the silicon nitride film as described above. In step ST2, the flow rate proportion of the phosphorus-containing gas with respect to the total flow rate of the process gas is set to set (control) the ratio of the etching rate of the alternate stack of silicon oxide films and silicon nitride films to the etching rate of the silicon oxide film. In step ST2, the flow rate proportion of the phosphorus-containing gas with respect to the total flow rate of the process gas may be set to reduce the difference between the etching rate of the silicon oxide film and the etching rate of the alternate stack of silicon oxide films and silicon nitride films. In one embodiment, the flow rate proportion of the phosphorus-containing gas with respect to the total flow rate of the process gas is set to cause the ratio of the etching rate of the alternate stack of silicon oxide films and silicon nitride films to the etching rate of the silicon oxide film to be 0.8 to 1.2 inclusive. The flow rate proportion of the phosphorus-containing gas may be set to, for example, 10 to 50% inclusive of the total flow rate of the process gas. During etching in step ST2, the flow rate of the phosphorus-containing gas may be changed to change the ratio of the etching rate of the alternate stack of silicon oxide films and silicon nitride films to the etching rate of the silicon oxide film.

In step ST2, the gas in the chamber 10 is set to a predetermined pressure. In step ST2, the gas in the chamber 10 may be set to a pressure of 10 mTorr (1.3 Pa) to 100 mTorr (13.3 Pa) inclusive. In step ST2, the first RF power and/or the second RF power are provided to generate plasma from the process gas in the chamber 10. The first RF power may be set to a power level of 2 to 10 kW inclusive. The second RF power may be set to a power level of 2 kW or more (or to a power level of 2.83 $W/cm^2$ per unit area of the substrate W). The second RF power may be set to a power level of 10 kW or more (or to a power level of 14.2 $W/cm^2$ per unit area of the substrate W).

To perform the processing in step ST2, the controller 80 controls the controllable gas supply to supply the process gas into the chamber 10. Moreover, the process gas may include a halogen component (or a part of the process gas) and a phosphorous component (or another part of the process gas), where plasma is generated from the process gas, as will be discussed. In this context the term species can refer to separate components of the process gas or combinations of the components of the process gas. The controller 80 also controls the exhaust device 50 to maintain the chamber 10 at a specified gas pressure. The controller 80 also controls the first RF power supply 62 and the second RF power supply 64 to supply the first RF power and/or the second RF power.

With the method MT according to one embodiment, the substrate W may be set to a temperature lower than or equal to 0° C. at the start of step ST2. At the set temperature of the substrate W, the silicon-containing film SF can be etched with a higher etching rate in step ST2. To set the temperature of the substrate W at the start of step ST2, the controller 80 may control the chiller unit). At lower temperature (below 0 degree C., for example), side etch amount decreases according to Arrhenius rate law, which dictates that a rate of reaction increases with temperature. At lower temperatures, the volatility (a measure of a material's tendency to vaporize) of the protective layer (P—O) decreases. For low volatility (chemically strong), the effectiveness of the protective layer to protect against the sidewall from being laterally etched increases at lower temperature. Moreover, for high aspect etching, ion energy tends to be higher, and so the present inventor recognized the benefit for an etching temperature that should be lower to enhance the effectiveness of the protective layer. Therefore, in the context of this disclosure, a protective layer with lower volatility (achieved through controlling a temperature of the substrate W to remain low) is more desirable because it helps to suppress sidewall etching (bowing).

In step ST2, the silicon-containing film SF is etched with a halogen chemical species in plasma generated from the process gas. In one embodiment, a part of the silicon-containing film SF exposed from the mask MK is etched selectively (refer to FIG. 4A).

In one embodiment, the method MT may further include step ST3 as shown in FIG. 1. In step ST3, a protective film PF is formed on the surface of a side wall defining a recess in the silicon-containing film SF formed by etching in step ST2 (refer to FIG. 4A). The protective film PF contains silicon and the phosphorus contained in the process gas used in step ST2. In one embodiment, step ST3 is performed at the same time as step ST2. In one embodiment, the protective film PF may further contain carbon and/or hydrogen contained in the process gas. In one embodiment, the protective film PF may further contain oxygen contained either in the process gas or in the silicon-containing film SF. In an experimental example in which a silicon oxide film is etched in step ST2, X-ray photoelectron spectroscopy (XPS) analysis of the protective film PF reveals a Si—O bond peak and a P—O bond peak. In an experimental example in which a silicon nitride film is etched in step ST2, XPS analysis of a protective film PF reveals a peak assigned to the Si—P bond and a peak assigned to the P—N bond.

Figure 4B:
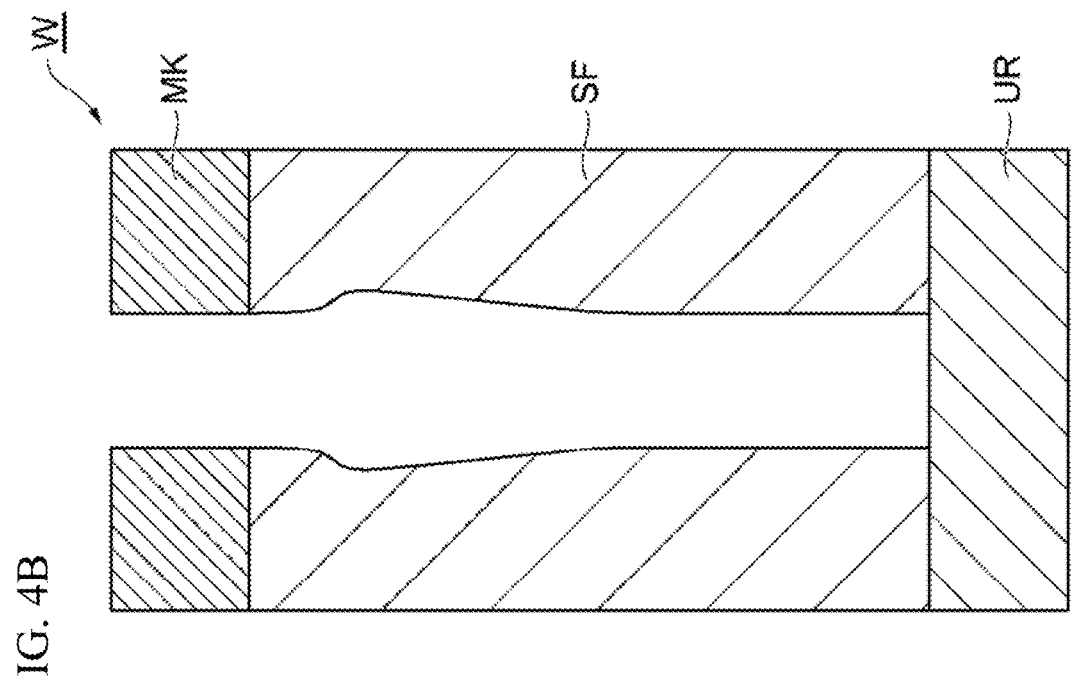
FIG. 4B is a partially enlarged cross-sectional view of an exemplary substrate etched with plasma generated from a phosphorus-free process gas.
Figure 4A:
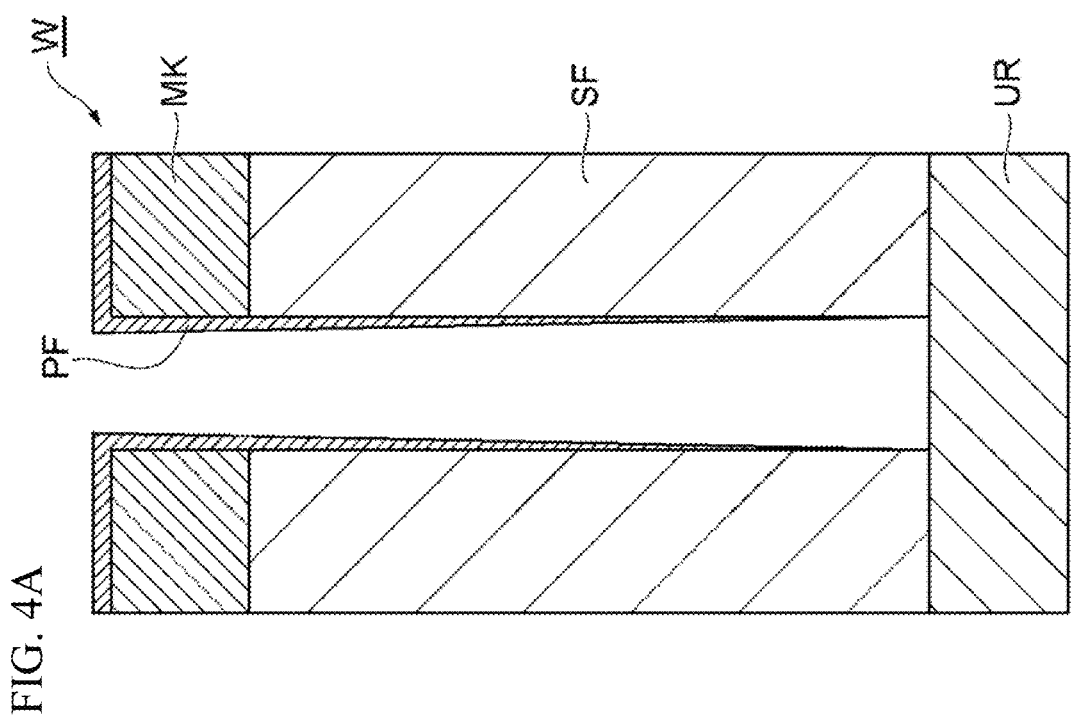
FIG. 4A is a partially enlarged cross-sectional view of an exemplary substrate processed with the etching method shown in FIG. 1.

With a phosphorus-free process gas, the silicon-containing film SF is etched laterally as shown in FIG. 4B. The resultant silicon-containing film SF can thus have a partly widened recess. For example, the silicon-containing film SF can have a recess partly widened around the mask MK.

With the method MT, the protective film PF is formed on the surface of a side wall defining a recess in the silicon-containing film SF formed by etching. The protective film PF then protects the side wall surface while the silicon-containing film SF is being etched. The method MT thus enables plasma etching of the silicon-containing film SF with reduced lateral etching.

Figure 5A:
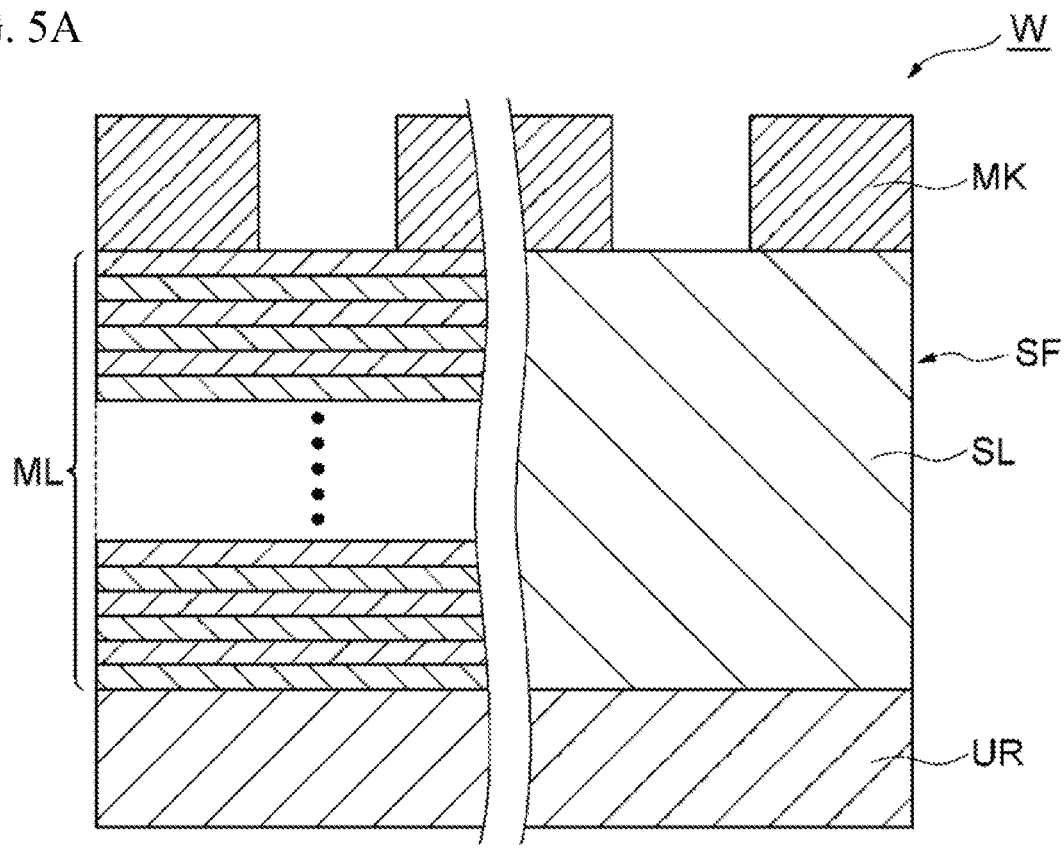
FIG. 5A is a partially enlarged cross-sectional view of another exemplary substrate to be processed with the etching method shown in FIG. 1.
Figure 5B:
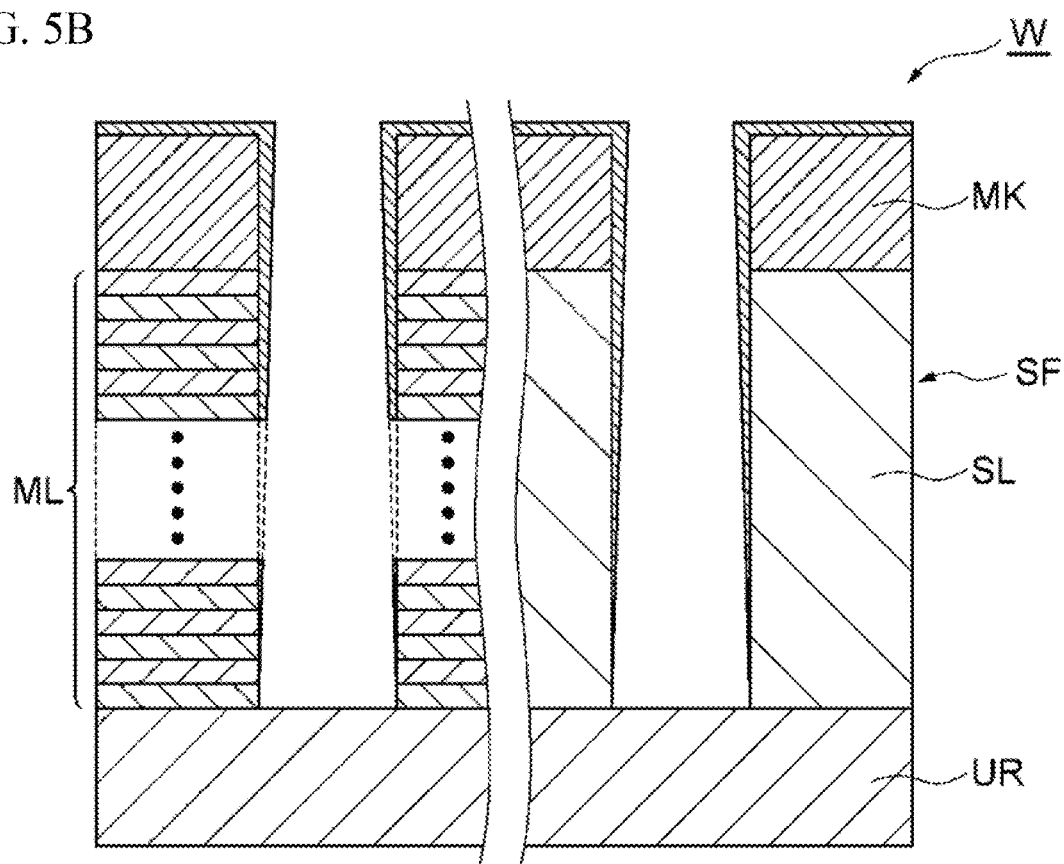
FIG. 5B is a partially enlarged cross-sectional view of another exemplary substrate processed with the etching method shown in FIG. 1.

FIG. 5A is a partially enlarged cross-sectional view of another exemplary substrate to be processed with the etching method shown in FIG. 1, and FIG. 5B is a partially enlarged cross-sectional view of another exemplary substrate processed with the etching method shown in FIG. 1. The substrate W shown in FIG. 5A includes a silicon-containing film SF including a single layer SL and a multilayer ML. The single layer SL may be, for example, a silicon oxide film, a silicon nitride film, or a polycrystalline silicon film. The multilayer ML may include a stack of one or more silicon oxide films and one or more silicon nitride films. The multilayer ML may include an alternate stack of multiple silicon oxide films and multiple silicon nitride films. The multilayer ML may include a stack of one or more silicon oxide films and one or more polycrystalline silicon films. The multilayer ML may include an alternate stack of multiple silicon oxide films and multiple polycrystalline silicon films. The multilayer ML may include a stack of one or more silicon oxide films, one or more polycrystalline silicon films, and one or more silicon nitride films.

The above method MT may be used for the substrate W shown in FIG. 5A. In step ST2 included in the method MT, the single layer SL and the multilayer ML are etched at the same time. As described above, the process gas containing the halogen and the phosphorus is used in step ST2. In one example, the process gas may contain $H_2$, $C_xH_yF_z$ (where x, y, and z are integers greater than or equal to 0), at least one fluorine containing molecule (except for $C_xH_yF_z$) or fluorine-containing molecule (except $C_xH_yF_z$), at least one halogen (except for fluorine) or halogen-containing molecule (except for fluorine), and any of the above phosphorus-containing molecules. The fluorine-containing molecule in the process gas may be, for example, $NF_3$, $SF_6$, or HF. The halogen or the halogen-containing molecule in the process gas may be, for example, $Cl_2$, HBr, HI, $ClF_3$, or $IF_7$. More specifically, the halogen or the halogen-containing molecule in the process gas may not contain fluorine. In some embodiments, the halogen or the halogen-containing molecule in the process gas may contain fluorine. The flow rate proportion of the gas containing a phosphorus-containing molecule is, for example, 3 to 20% inclusive of the total flow rate of the process gas. The substrate W may be set to a temperature lower than or equal to 0° C., or for example, to −40° C. or to −70° C., at the start of step ST2.

As shown in FIG. 5B, with the method MT, the single layer SL and the multilayer ML are etched while the side wall surface is being protected by the protective film PF. The method MT thus enables plasma etching of the single layer SL and the multilayer ML at the same time with reduced lateral etching. With the above process gas used in step ST2, the single layer SL and the multilayer ML are etched with the etching rates having a smaller difference between them.

A first experiment conducted for evaluating the method MT will now be described. In the first experiment, multiple sample substrates were prepared. Each of the sample substrates includes a silicon oxide film and a mask on the silicon oxide film. In the first experiment, the silicon oxide film in each of the sample substrates was etched with the method MT. For each sample substrate, a process gas containing $PF_3$ with a different flow rate was used for etching the silicon oxide film (in step ST2). Step ST2 is performed under the other conditions described below.

Conditions for step ST2:

Gas pressure in the chamber 10: 25 mTorr (3.3 Pa)

Process gas: $CH_4$, 50 sccm; $CF_4$, 100 sccm; and $O_2$, 50 sccm

First RF power: 40 MHz, 4500 W

Second RF power: 400 kHz, 7000 W

Substrate temperature (substrate support temperature before etching): −30° C.

Processing time: 600 s

Figure 6:
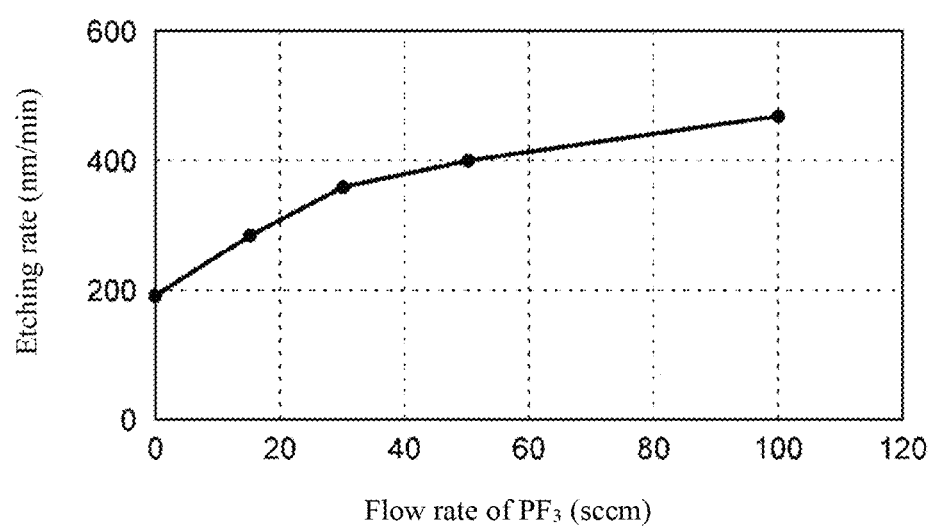
FIG. 6 is a graph showing the relationship between the flow rate of $PF_3$ in a process gas and the etching rate of a silicon oxide film, obtained in a first experiment.
Figure 7:
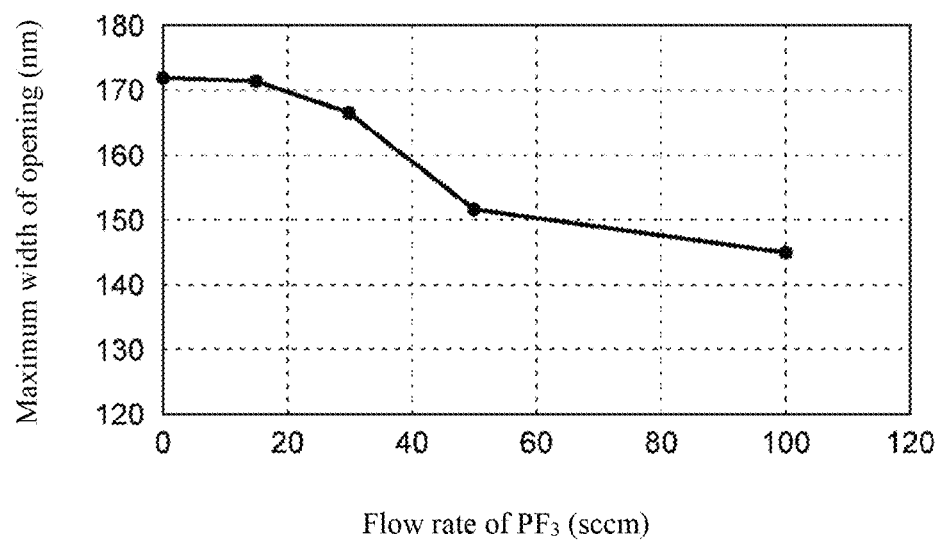
FIG. 7 is a graph showing the relationship between the flow rate of $PF_3$ in the process gas and the maximum width of an opening of a recess in the silicon oxide film, obtained in the first experiment.

For each of the sample substrates, the maximum width of an opening of a recess formed in the silicon oxide film and the etching rate of the silicon oxide film were determined in the first experiment. The relationship between the flow rate of $PF_3$ in the process gas used in step ST2 and the etching rate of the silicon oxide film was then obtained. The relationship between the flow rate of $PF_3$ in the process gas used in step ST2 and the maximum width of the opening of the recess in the silicon oxide film was also obtained. FIG. 6 shows the relationship between the flow rate of $PF_3$ in the process gas and the etching rate of the silicon oxide film. FIG. 7 shows the relationship between the flow rate of $PF_3$ in the process gas and the maximum width of the opening of the recess in the silicon oxide film. The graph of FIG. 6 shows that the process gas containing the phosphorus increases the etching rate of the silicon oxide film. The results reveal that the etching rate obtained with the process gas containing $PF_3$ at the flow rate of 20 sccm or more is about 1.5 times the etching rate obtained with the process gas containing no $PF_3$. The graph of FIG. 7 shows that the process gas containing the phosphorus protects the side wall surface and reduces the maximum width of the opening of the recess in the silicon oxide film, or specifically reduces the likelihood that the recess in the silicon oxide film widens partly. In particular, the process gas containing $PF_3$ at the flow rate of 15 sccm reduces the likelihood that the recess in the silicon oxide film widens partly, or in other words, protects the side wall surface more effectively. The process gas containing $PF_3$ at the flow rate of 50 sccm or more notably reduces the likelihood that the recess in the silicon oxide film widens partly. In other words, the process gas containing $PF_3$ at the flow rate of 50 sccm or more notably protects the side wall surface.

A second experiment conducted for evaluating the method MT will now be described. In the second experiment, a first sample substrate and a second sample substrate were prepared. The first sample substrate includes a single layer that is a silicon oxide film. The second sample substrate includes an alternate stack of multiple silicon oxide films and multiple silicon nitride films. In the second experiment, the single layer in the first sample substrate and the multilayer in the second sample substrate were etched with the method MT by the plasma processing apparatus 1. The etching (step ST2) was performed using process gases each containing Hz, a hydrofluorocarbon, a fluorine-containing molecule, a halogen-containing molecule, or any one of the above phosphorus-containing molecules. A comparative experiment was also conducted. The comparative experiment uses process gases different from those used in step ST2 in the second experiment for etching the single layer in the first sample substrate and the multilayer in the second sample substrate. Unlike the process gases used in step ST2 in the second experiment, the process gases used in the comparative experiment contain no phosphor-containing molecules.

In the second experiment and the comparative experiment, the ratio of the etching rate of the multilayer to the etching rate of the single layer was determined. For the comparative experiment, the ratio was about 1.3 when the first sample substrate and the second sample substrate were each set to a temperature of −40° C. at the start of the etching. For the second experiment, the ratio was about 1.17 when the first sample substrate and the second sample substrate were each set to a temperature of −40° C. at the start of the etching. For the second experiment, the ratio was about 1.05 when the first sample substrate and the second sample substrate were each set to a temperature of −70° C. at the start of the etching. The experimental results reveal that the use of the process gas containing a phosphorus-containing molecule in step ST2 can reduce the difference between the etching rate of the single layer and the etching rate of the multilayer to, for example, the ratio of 1.2 or less. The results also reveal that the difference between the etching rate of the single layer and the etching rate of the multilayer is smaller as the substrate is at a lower temperature at the start of the etching.

A third experiment conducted for evaluating the method MT will now be described. In the third experiment, multiple first sample substrates and multiple second sample substrates were prepared. The first sample substrates each include a silicon oxide film (a single layer). The second sample substrates each include an alternate stack of silicon oxide films and silicon nitride films. In the third experiment, the single layer in each of the first sample substrates and the alternate stack in each of the second sample substrates were etched with the method MT by the plasma processing apparatus 1. The etching (step ST2) was performed using process gases each containing Hz, a hydrofluorocarbon, a fluorine-containing molecule, halogen-containing molecule (except for fluorine), and a gas containing a halogen and phosphorus ($PF_3$ gas). In the third experiment, the single layers in the first sample substrates were etched under multiple conditions including different etching temperatures combined with $PF_3$ gases with different flow rate proportions. The etching temperature refers to the temperature of the sample substrate at the start of the etching (temperature of heat exchange medium). The flow rate proportion of the $PF_3$ gas refers to the proportion of the flow rate of the $PF_3$ gas with respect to the total flow rate of the process gas. The alternate stacks in the second sample substrates were also etched under the multiple conditions including the etching temperatures combined with the $PF_3$ gases with the flow rate proportions used in the etching of the single layers in the first sample substrates. The single layers in the first sample substrates and the alternate stacks in the second sample substrates were etched with the second RF power having an effective power of 6 kW.

Figure 8:
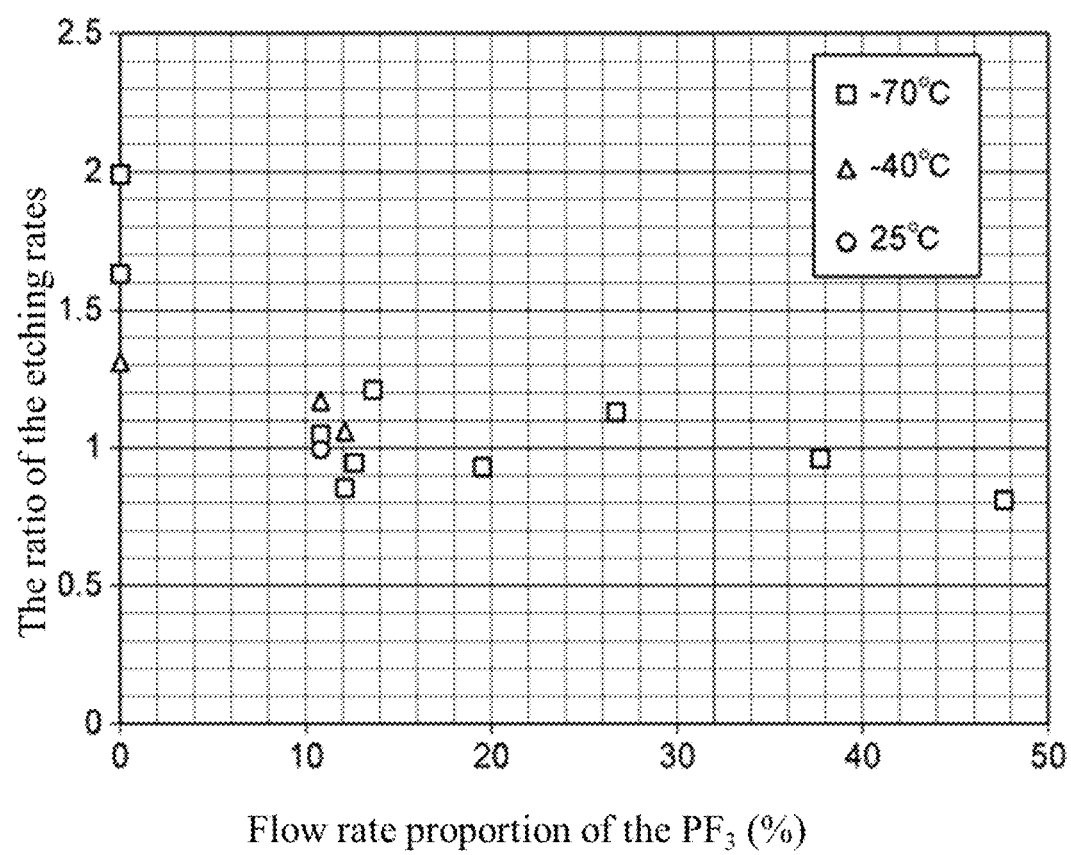
FIG. 8 is a graph showing the flow rate proportion of the $PF_3$ and the ratio of the etching rates, obtained in a third experiment.

For each of the single layers in the first sample substrates, the etching rate was determined based on the etching result in the third experiment. For each of the alternate stacks in the second sample substrates, the etching rate was determined based on the etching result. The ratio of the etching rate of the alternate stack of silicon oxide films and silicon nitride films to the etching rate of the silicon oxide film (single layer) was determined under each of the above conditions. The relationship between the flow rate proportion of the $PF_3$ gas and the ratio of the etching rates was then obtained. FIG. 8 is a graph showing the flow rate proportion of the $PF_3$ and the ratio of the etching rates, obtained in the third experiment. As shown in FIG. 8, the results of the third experiment reveal that controlling the flow rate proportion of the $PF_3$ allows the control of the ratio of the etching rates. The results also reveal that setting the flow rate proportion of the $PF_3$ to 10 to 50% inclusive allows the setting of the ratio of the etching rates to 0.8 to 1.2 inclusive independently of the sample substrate temperature at the start of the etching.

Although the exemplary embodiments have been described above, the embodiments are not restrictive, and various additions, omissions, substitutions, and changes may be made. The components in the different exemplary embodiments may be combined to form another exemplary embodiment.

The plasma processing apparatus using the method MT may be a capacitively coupled plasma processing apparatus other than the plasma processing apparatus 1. The plasma processing apparatus using the method MT may be an inductively coupled plasma processing apparatus, an electron cyclotron resonance (ECR) plasma processing apparatus, or a plasma processing apparatus that generates plasma using surface waves such as microwaves.

The plasma processing apparatus may include, either in place of or in addition to the second RF power supply 64, a DC power supply that intermittently or periodically applies a pulsed negative DC voltage to the lower electrode 18. An advantage offered by pulsing the electric power for biasing, during etching is that a bifurcation of etching and deposition phases is created, rather than mainly deposition or mainly etching. Moreover, when bias electric power is supplied to a bottom electrode, etching mainly occurs. On the other hand, when bias electric power is not supplied to the bottom electrode, deposition mainly occurs. By applying pulsed bias electric power, separate, but interleaved, etch phases and deposition phases are realized. For the etch phase, the etching occurs after the protective film is formed, and then the sidewall of the recess is protected from side-etch. Thus, successive phases of forming a protection film (deposition) followed by etching results in controlled etching that suppresses side-wall bowing while a depth of the recess continues to deepen. In addition, changing the duty cycle of the pulse ((Bias-on time/(Bias-on time+Bias-off time)) provides a mechanism for controlling a balance between etch/deposition phases. A longer Bias-off time helps form a thicker protective layer, which leads to more protection from sidewall etch. Longer Bias-on time increase etch rate, thus controlling the time required to reach a predetermined etch depth.

Figure 9:
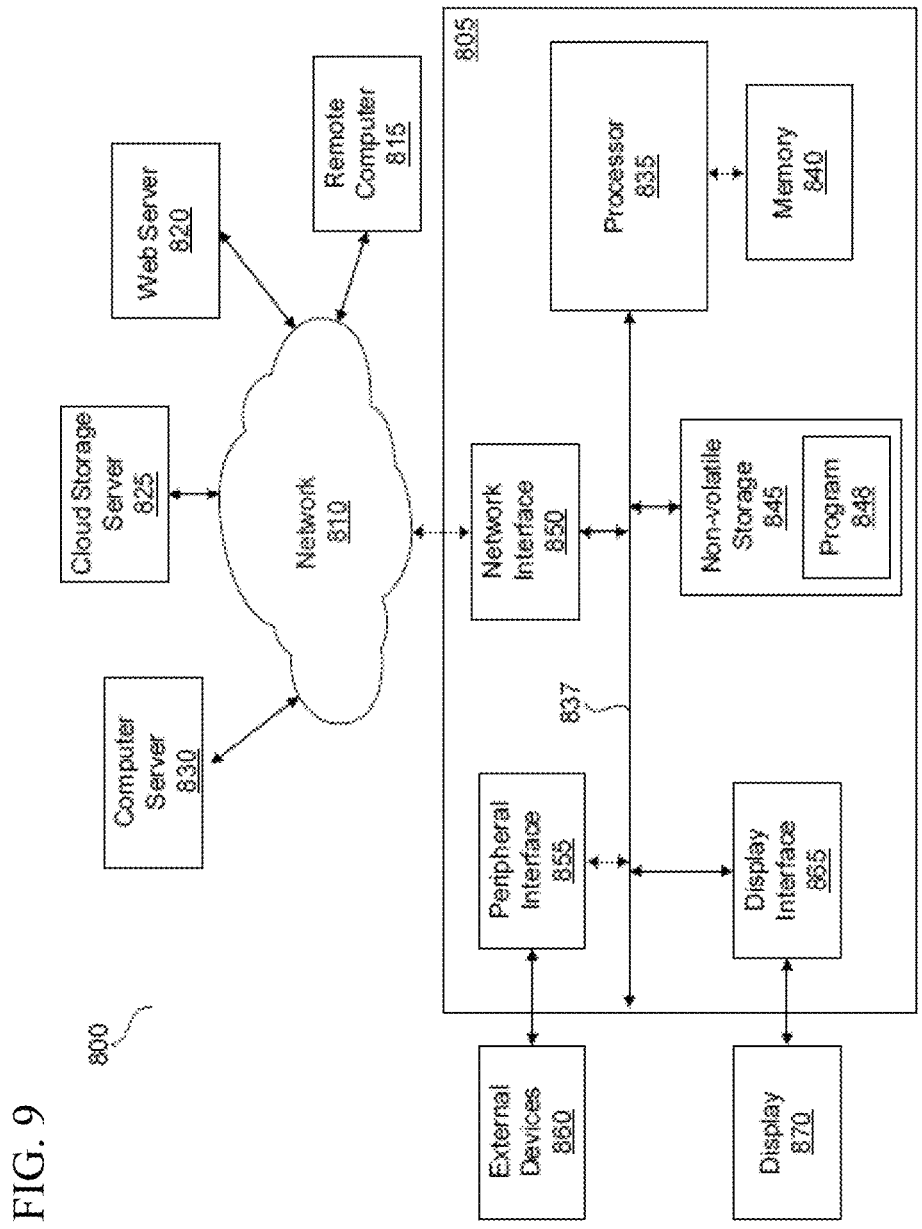
FIG. 9 is a diagram of controller circuitry used to control process operations, such as the plasma treatment system of FIG. 3 and other processes and equipment described herein

FIG. 9 is a block diagram of processing circuitry for performing computer-based operations described herein. FIG. 9 illustrates control circuitry 130 that may be used to control any computer-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 9, the processing circuitry 130 includes a CPU 1200 which performs one or more of the control processes described above/below. The process data and instructions may be stored in memory 1202. These processes and instructions may also be stored on a storage medium disk 1204 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 130 communicates, such as a server or computer.

Further, the claimed advancements may be provided as a utility application, background daemon, or component of an operating system, or combination thereof, executing in conjunction with CPU 1200 and an operating system such as Microsoft Windows, UNIX, Solaris, LINUX, Apple MAC-OS and other systems known to those skilled in the art.

The hardware elements in order to achieve the processing circuitry 130 may be realized by various circuitry elements. Further, each of the functions of the above described embodiments may be implemented by circuitry, which includes one or more processing circuits. A processing circuit includes a particularly programmed processor, for example, processor (CPU) 1200, as shown in FIG. 9. A processing circuit also includes devices such as an application specific integrated circuit (ASIC) and conventional circuit components arranged to perform the recited functions.

In FIG. 9, the processing circuitry 130 includes a CPU 1200 which performs the processes described above. The processing circuitry 130 may be a general-purpose computer or a particular, special-purpose machine.

Alternatively, or additionally, the CPU 1200 may be implemented on an FPGA, ASIC, PLD or using discrete logic circuits, as one of ordinary skill in the art would recognize. Further, CPU 1200 may be implemented as multiple processors cooperatively working in parallel to perform the instructions of the inventive processes described above.

The processing circuitry 130 in FIG. 9 also includes a network controller 1206, such as an Intel Ethernet PRO network interface card from Intel Corporation of America, for interfacing with network 1228. As can be appreciated, the network 1228 can be a public network, such as the Internet, or a private network such as an LAN or WAN network, or any combination thereof and can also include PSTN or ISDN sub-networks. The network 1228 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 130 further includes a display controller 1208, such as a graphics card or graphics adaptor for interfacing with display 1210, such as a monitor. A general purpose I/O interface 1212 interfaces with a keyboard and/or mouse 1214 as well as a touch screen panel 1216 on or separate from display 1210. General purpose I/O interface also connects to a variety of peripherals 1218 including printers and scanners.

The general-purpose storage controller 1224 connects the storage medium disk 1204 with communication bus 1226, which may be an ISA, EISA, VESA, PCI, or similar, for interconnecting all of the components of the processing circuitry 130. A description of the general features and functionality of the display 1210, keyboard and/or mouse 1214, as well as the display controller 1208, storage controller 1224, network controller 1206, sound controller 1220, and general purpose I/O interface 1212 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus
10 Chamber
W Substrate
SF Silicon-containing film

What is claimed is:

1. An etching method, comprising:
   providing a substrate in a chamber of a plasma processing apparatus, the substrate including a silicon-containing film that at least includes a silicon oxide film and a silicon nitride film;
   supplying a process gas to the chamber, the process gas containing a halogen component and a phosphorous-containing gas as a phosphorus component; and
   etching the silicon-containing film with a plasma generated from the process gas, wherein
   the etching includes setting a flow rate proportion of the phosphorus-containing gas with respect to a total flow rate of the process gas so as to establish a ratio of an etching rate of an alternate stack of the silicon oxide film and the silicon nitride film to an etching rate of the silicon oxide film, and
   the ratio is in an inclusive range of 0.8 to 1.2.

2. The etching method according to claim 1, further comprising:
   forming a protective film on a surface of a side wall of a recess formed in the silicon-containing film by the etching, the protective film containing phosphorus provided by the phosphorous-containing gas.

3. The etching method according to claim 2, wherein the etching and the forming the protective film are performed at a same time.

4. The etching method according to claim 1, wherein the phosphorous-containing gas contains at least one molecule selected from the group consisting of $PF_3$, $PCl_3$, $PF_5$, $PCl_5$, $POCl_3$, $PH_3$, $PBr_3$, and $PBr_5$.

5. The etching method according to claim 1, wherein the process gas further contains carbon and hydrogen.

6. The etching method according to claim 5, wherein a hydrogen component of the process gas contains at least one molecule selected from the group consisting of $H_2$, HF, $C_xH_y$, $CH_xF_y$, and $NH_3$, where x and y are natural numbers.

7. The etching method according to claim 1, wherein the process gas further comprises a halogen component that contains fluorine.

8. The etching method according to claim 1, wherein the process gas further contains oxygen.

9. The etching method according to claim 1, wherein the silicon-containing film further includes a silicon film.

10. The etching method according to claim 1, wherein
    the silicon-containing film includes a single layer film and a multilayer film, and
    the etching includes etching the single layer film and the multilayer film at a same time.

11. The etching method according to claim 10, wherein the multilayer film includes
    a stack of one or more silicon oxide films and one or more silicon nitride films,
    a stack of one or more silicon oxide films and one or more polycrystalline silicon films, or
    a stack of one or more silicon oxide films, one or more polycrystalline silicon films, and one or more silicon nitride films.

12. The etching method according to claim 10, wherein the single layer film is a silicon oxide film, a silicon nitride film, or a polycrystalline silicon film.

13. The etching method according to claim 10, wherein the flow rate proportion is set to be 10-50% inclusive.

14. The etching method according to claim 1, wherein the substrate further includes a mask on the silicon-containing film.

15. The etching method according to claim 1, further comprising:
    setting a temperature of the substrate to lower than or equal to 0° C. at a start of the etching.

16. The etching method according to claim 1, wherein the flow rate proportion is set to be 10-50% inclusive.

17. An etching method, comprising:
    providing a substrate in a chamber of a plasma processing apparatus, the substrate including a silicon-containing film that at least includes a silicon oxide film and a silicon nitride film;
    supplying a process gas to the chamber, the process gas containing a halogen component and a phosphorous-containing gas as a phosphorus component;
    etching the silicon-containing film with a plasma generated from the process gas;
    forming a protective film on a surface of a side wall of a recess formed in the silicon-containing film by the etching, the protective film containing phosphorus provided by the phosphorous-containing gas; and
    setting a temperature of the substrate to lower than or equal to 0° C. at a start of the etching, wherein
    the etching and the forming the protective film are performed at a same time,
    the silicon-containing film includes a single layer film and a multilayer film, and
    the etching includes etching the single layer film and the multilayer film at a same time.

18. An etching method, comprising:
    providing a substrate in a chamber of a plasma processing apparatus, the substrate including a silicon-containing film that at least includes a silicon oxide film and a silicon nitride film;
    supplying a process gas to the chamber, the process gas containing at least one of a fluorocarbon or a hydrofluorocarbon, at least one phosphorous-containing gas, and at least one hydrogen-containing gas selected from the group consisting of $H_2$, hydrogen fluoride, a hydrocarbon, a hydrofluorocarbon and $NH_3$; and
    etching the silicon-containing film with a plasma generated from the process gas, wherein
    the silicon-containing film includes a single layer film and a multilayer film, and
    the etching includes:
        etching the single layer film and the multilayer film at a same time, and setting a flow rate proportion of the phosphorus-containing gas with respect to a total flow rate of the process gas so as to establish a ratio of an etching rate of an alternate stack of the silicon oxide film and the silicon nitride film to an etching rate of the silicon oxide film, the ratio being in an inclusive range of 0.8 to 1.2.

19. The etching method according to claim 18, wherein the phosphorous-containing gas contains phosphorous and halogen.

20. The etching method according to claim 19, wherein the halogen is fluorine and/or non-fluorine halogen.

* * * * *